(12) United States Patent
Wang et al.

(10) Patent No.: US 10,099,411 B2
(45) Date of Patent: Oct. 16, 2018

(54) METHOD AND APPARATUS FOR SIMULTANEOUSLY ENCAPSULATING SEMICONDUCTOR DIES WITH LAYERED LEAD FRAME STRIPS

(71) Applicant: Infineon Technologies AG, Neubiberg (DE)

(72) Inventors: Choon Huey Wang, Melaka (MY); Chau Fatt Chiang, Melaka (MY); Swee Kah Lee, Melaka (MY); Chee Hong Fang, Ipoh (MY)

(73) Assignee: Infineon Technologies AG, Neubiberg (DE)

( * ) Notice: Subject to any disclaimer, the term of this patent is extended or adjusted under 35 U.S.C. 154(b) by 425 days.

(21) Appl. No.: 14/720,126

(22) Filed: May 22, 2015

(65) Prior Publication Data

US 2016/0339616 A1    Nov. 24, 2016

(51) Int. Cl.
   *B29C 45/14*    (2006.01)
   *H01L 21/56*    (2006.01)
   (Continued)

(52) U.S. Cl.
   CPC .... *B29C 45/14655* (2013.01); *B29C 45/2708* (2013.01); *B29C 45/2725* (2013.01);
   (Continued)

(58) Field of Classification Search
   CPC .............................................. B29C 45/14655
   See application file for complete search history.

(56) References Cited

U.S. PATENT DOCUMENTS

| 4,480,975 A | * | 11/1984 | Plummer | .............. | H01L 21/565 |
| | | | | | 249/134 |
| 5,349,136 A | * | 9/1994 | Abe | ................. | B29C 45/14655 |
| | | | | | 174/536 |

(Continued)

FOREIGN PATENT DOCUMENTS

| DE | 102016109227 A1 | * | 2/2017 | ....... | B29C 45/14655 |
| JP | 01115130 A | * | 5/1989 | ......... | B29C 45/2708 |

(Continued)

OTHER PUBLICATIONS

Partial machine translation of JP 2001-044225A dated Feb. 2001 obtained from the JPO website. (Year: 2001).*

(Continued)

*Primary Examiner* — Robert B Davis
(74) *Attorney, Agent, or Firm* — Murphy, Bilak & Homiller, PLLC

(57) ABSTRACT

A mold injection tool includes a first mold plate having first and second columns of mold cavities, each of the cavities and a first cull block arranged between the first and second columns. A plurality of first channel sections is formed between an adjacent pair of mold cavities. Each of the first channel sections are configured to guide liquefied molding material from the first cull block into the adjacent pair of mold cavities in the first and second columns. The mold injection tool further includes a second mold plate having similarly configured mold cavities, cull block, and channel section. Adjacent ones of the first and second channel sections form a contained chamber when the first and second mold plates are pressed together. The mold plates are configured to inject liquefied molding material through an entrance that is in open communication with each contained chamber.

12 Claims, 12 Drawing Sheets

(51) Int. Cl.
*B29C 45/27* (2006.01)
*B29C 45/32* (2006.01)
*B29L 31/34* (2006.01)

(52) U.S. Cl.
CPC ............ *B29C 45/32* (2013.01); *H01L 21/565* (2013.01); *B29L 2031/34* (2013.01); *H01L 2224/48091* (2013.01); *H01L 2224/73265* (2013.01); *H01L 2924/19105* (2013.01)

(56) References Cited

U.S. PATENT DOCUMENTS

| | | | |
|---|---|---|---|
| 5,635,220 A * | 6/1997 | Izumi | B29C 45/14655 264/272.17 |
| 5,650,177 A * | 7/1997 | Kojima | B29C 33/56 249/114.1 |
| 5,971,734 A * | 10/1999 | Moon | B29C 45/14655 264/272.17 |
| 5,998,243 A * | 12/1999 | Odashima | B29C 45/14655 257/E21.503 |
| 6,106,259 A | 8/2000 | Lee et al. | |
| 6,746,895 B2 | 6/2004 | Bolken et al. | |
| 7,170,158 B2 * | 1/2007 | Choi | H01L 21/565 249/90 |
| 7,521,297 B2 | 4/2009 | Lee et al. | |
| 8,603,859 B2 | 12/2013 | Yang et al. | |
| 2002/0051831 A1 * | 5/2002 | Thummel | B29C 45/14655 425/116 |
| 2004/0158978 A1 * | 8/2004 | Lee | B29C 70/72 29/841 |
| 2004/0178514 A1 | 9/2004 | Lee et al. | |
| 2007/0099341 A1 | 5/2007 | Lo | |
| 2013/0140737 A1 * | 6/2013 | Keong | B29C 45/14065 264/272.15 |
| 2014/0264797 A1 | 9/2014 | Ota et al. | |

FOREIGN PATENT DOCUMENTS

| | | | | |
|---|---|---|---|---|
| JP | 2001044225 A | * | 2/2001 | |
| JP | 2005191064 A | * | 7/2005 | ............. H01L 24/97 |

OTHER PUBLICATIONS

Partial machine translation of JP 2005-191064A dated Jul. 2005 obtained from the JPO website. (Year: 2005).*

EPO abstract of JP 2001-044225A dated Feb. 2001 obtained from the espace website. (Year: 2001).*

* cited by examiner

METHOD AND APPARATUS FOR SIMULTANEOUSLY ENCAPSULATING SEMICONDUCTOR DIES WITH LAYERED LEAD FRAME STRIPS

TECHNICAL FIELD

The instant application relates to molding techniques, and more particularly to techniques for simultaneously encapsulating semiconductor dies in lead frame strip configurations at increased efficiency and reduced processing expense.

BACKGROUND

Integrated circuit devices, such as semiconductor chips, are commonly packaged using a lead frame and encapsulant. For example, one or more semiconductor chips may be physically attached and electrically connected to a lead frame. The encapsulant covers the lead frame, semiconductor chip and electrical connections. The lead frame includes external electrical terminals that allow the semiconductor chip to be electrically connected to a printed circuit board, for example. This packaging arrangement allows for an electrical connection between the semiconductor chips and other devices to be effectuated while simultaneously protecting the semiconductor chip and electrical connections from damaging environmental conditions, such as moisture, temperature, foreign particles, etc.

Many semiconductor processing techniques utilize lead frame strips to simultaneously process a number of semiconductor devices. A lead frame strip includes a number of unit lead frames connected to one another. Each unit lead frame provides the lead construction for a single packaged device. One or more semiconductor dies can be affixed to and electrically connected with each unit lead frame. Subsequently, a molding process can be applied to the lead frame strip to encapsulate each of the semiconductor dies. Eventually, the unit lead frames are singulated from one another to form individual packaged devices. Thus, the lead frame strips allows for parallel processing steps that increase the throughput and reduce the expense of semiconductor manufacturing processes.

There are a variety of molding techniques that may be utilized to simultaneously encapsulate a number of semiconductor dies on a lead frame strip. For instance, a transfer molding process may be performed. In a transfer molding process, the encapsulant structure is formed by a liquefied encapsulant material, such as a thermoset resin or an epoxy. The liquefied encapsulant material is injected into a cavity that surrounds the semiconductor die (or dies) on each unit lead frame. The liquefied encapsulant material is then hardened into a solid state and the cavity mold structure is removed.

One limiting factor in every transfer molding process is the number of molding cavities that the molding tool has to accommodate individual semiconductor dies from the lead frame strips. Increasing the number of molding cavities typically requires an increase in the size of the molding tool, which in turn increases the cost of the molding process. Another limiting factor in every transfer molding process is the amount of time required to harden the liquefied encapsulant material for a given batch of unit lead frames. It is therefore desirable to increase the throughput of transfer molding processes by increasing the number of unit lead frames that can be molded in a given amount of time.

SUMMARY

A mold injection tool for encapsulating lead frame strip mounted semiconductor dies is disclosed. According to an embodiment, the mold injection tool includes a first mold plate having first and second columns of mold cavities, each of the cavities in the first and second columns being formed in an inner side of the first mold plate, and a first cull block arranged between the first and second columns. A plurality of first channel sections are formed in the inner side of the first mold plate between an adjacent pair of mold cavities in the first and second columns, with each of the first channel sections being configured to guide liquefied molding material from the first cull block into the adjacent pair of mold cavities in the first and second columns. The mold injection tool further includes a second mold plate having third and fourth columns of mold cavities, each of the cavities in the third and fourth columns being formed in an inner side of the second mold plate, and a second cull block arranged between the third and fourth columns. A plurality of second channel sections are formed in the inner side of the second mold plate between an adjacent pair of mold cavities in the third and fourth columns, with each of the second channel sections being configured to guide liquefied molding material from the second cull block into the adjacent pair of mold cavities in the third and fourth columns. Adjacent ones of the first and second channel sections form a contained chamber when the first and second mold plates are pressed together with the inner sides of the first and second mold plates facing one another. At least one of the first and second mold plates is configured to inject liquefied molding material through an entrance that is in open communication with each contained chamber.

An assembly for simultaneously encapsulating a plurality of semiconductor dies is disclosed. According to an embodiment, the assembly includes a first mold plate having first and second columns of mold cavities, each of the cavities in the first and second columns being formed in an inner side of the first mold plate, and a first cull block arranged between the first and second columns. A plurality of first channel sections are formed in the inner side of the first mold plate between an adjacent pair of mold cavities in the first and second columns, with each of the first channel sections being configured to guide liquefied molding material from the first cull block into the adjacent pair of mold cavities in the first and second columns. The assembly further includes a second mold plate having third and fourth columns of mold cavities, each of the cavities in the third and fourth columns being formed in an inner side of the second mold plate, and a second cull block arranged between the third and fourth columns. A plurality of second channel sections are formed in the inner side of the second mold plate between an adjacent pair of mold cavities in the third and fourth columns, with each of the second channel sections being configured to guide liquefied molding material from the second cull block into the adjacent pair of mold cavities in the third and fourth columns. The first mold plate is dimensioned to receive a first pair of lead frame strips in the first and second columns such that each of the mold cavities in the first and second columns receive at least one semiconductor die affixed to one of the lead frame strips in the first pair. The second mold plate is dimensioned to receive a second pair of lead frame strips in the third and fourth columns such that each of the mold cavities in the third and fourth columns receive at least one semiconductor die affixed to one of the lead frame strips in the second pair.

A method of encapsulating lead frame strip mounted semiconductor dies is disclosed. According to an embodiment, the method includes providing a first mold plate having first and second columns of mold cavities, each of the cavities in the first and second columns being formed in an inner side of the first mold plate, and a first cull block arranged between the first and second columns. The method further includes providing a second mold plate having third and fourth columns of mold cavities, each of the cavities in the third and fourth columns being formed in an inner side of the second mold plate, and a second cull block arranged between the third and fourth columns. The method further includes loading a first pair of lead frame strips so that the mold cavities in the first and second columns of the first mold plate each receive at least one semiconductor die of the lead frame strips in the first pair, and loading a second pair of lead frame strips so that the mold cavities in the third and fourth columns of the second mold plate each receive at least one semiconductor die of the lead frame strips in the second pair. The method further includes pressing the first and second mold plates against one another such that the second pair of lead frame strips is positioned on top of the first pair of lead frame strips and such that the semiconductor dies of the lead frame strips in the first pair face away from the semiconductor dies of the lead frame strips in the second pair. The method further includes injecting liquefied molding material into the mold cavities in the first, second, third and fourth columns so as to encapsulate the semiconductor dies mounted to the first and the second pair of lead frame strips.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
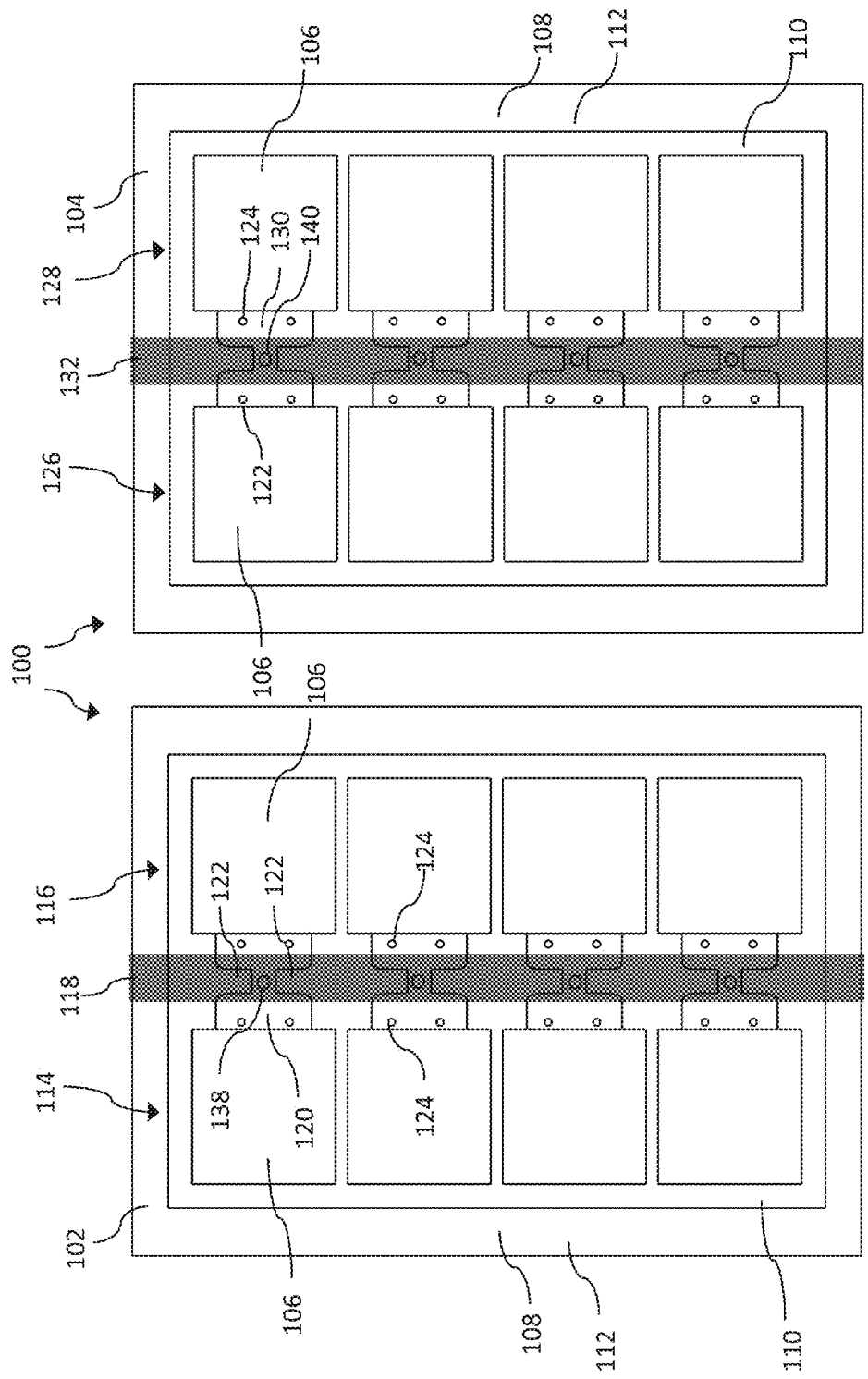
FIG. 1 illustrates a plan view of first and second mold plates that form components of a mold injection tool, according to an embodiment.

Embodiments disclosed herein include a method of encapsulating lead frame mounted semiconductor dies and a corresponding molding tool for carrying out the method. The mold injection tool includes a first mold plate with a plurality (i.e., two or more) of mold cavities being formed in an inner surface of the first mold plate. The cavities are dimensioned slightly larger than a predetermined die volume so as to cover a die (or dies) for the injection of liquefied molding materials into the cavities. The mold cavities may be arranged in vertical columns, such as vertical columns of four. According to an embodiment, the first mold plate includes two of the vertical columns arranged adjacent to one another. The vertical columns are configured such that a lead frame strip may be loaded into one of the columns. Thus, the first mold plate accommodates a pair (i.e., two) lead frame strips. The first mold plate includes a first cull block, and first mold flow chambers between the mold cavities that are configured to guide liquefied molding material into the mold cavities for each lead frame strip. To effectuate the molding process, a second mold plate is needed to press the lead frame strips against the first mold plate and to provide a backstop for liquefied molding material flowing along the first cull block and through the first mold flow chambers.

The embodiments disclosed herein advantageously differ from the conventional methods and associated molding tools in that a second mold plate of the mold injection tool acts not only as a backstop for liquefied molding material but also accommodates its own set or sets of lead frame strips. Thus, the mold injection tool and corresponding processes described herein double the throughput of conventional molding techniques in which one of the mold plates does not include separate cavities for the molding of semiconductor dies. The second mold plate of the mold injection tool described herein may be configured substantially similar to the first mold plate. For example, the second mold plate may include identically dimensioned vertical columns of mold cavities. Thus, in the case of a two column per mold plate configuration, four lead frame strips can be loaded into the mold injection tool and molded simultaneously. The lead frame strips can be layered in a back-to-back configuration, with the semiconductor dies in the mold cavities of the first mold plate facing away from the semiconductor dies in the mold cavities of the second mold plate. Furthermore, the cull blocks and channel sections that feed liquefied molding material into the cavities are dimensioned such that the mold cavities in both the first and second mold plates simultaneously fill at the same rate. Thus, the embodiments disclosed herein make efficient use of the available space in a molding tool by doubling the amount of lead frame strips that can be molded at one time without increasing the amount of time required to form and harden the moldering material. Further advantages will be appreciated to those of ordinary skill in view of the foregoing description.

Figure 2:
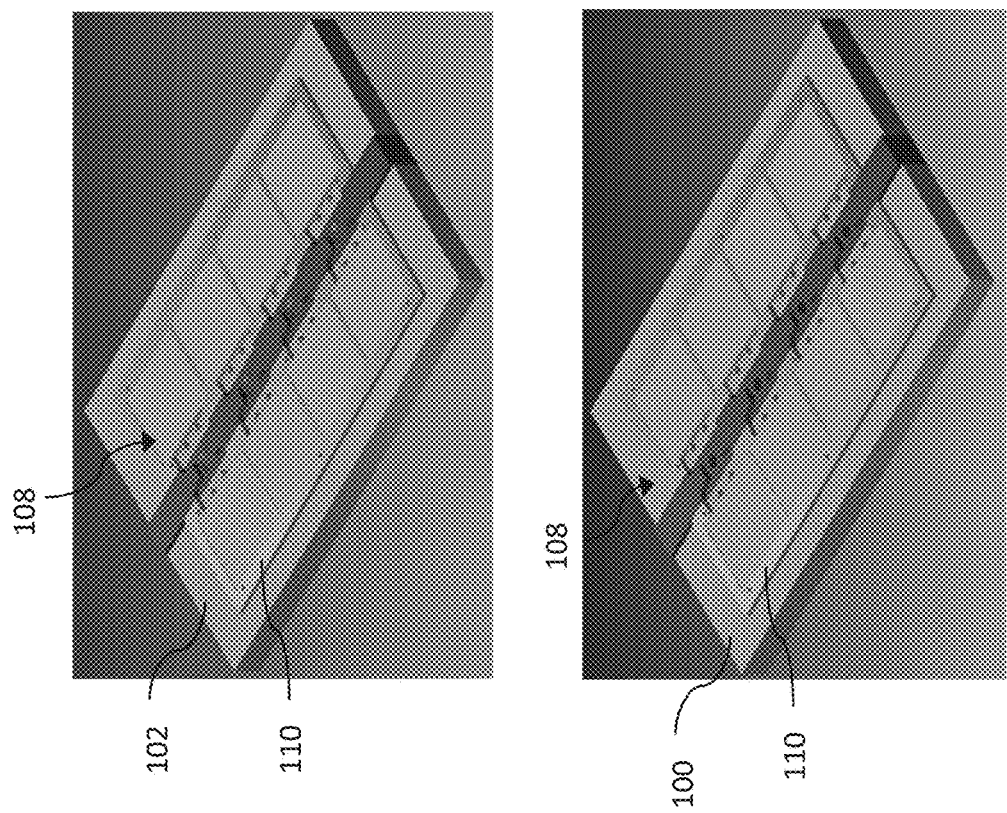
FIG. 2 illustrates a diagonal view of first and second mold plates that form components of a mold injection tool, according to an embodiment.
Figure 3:
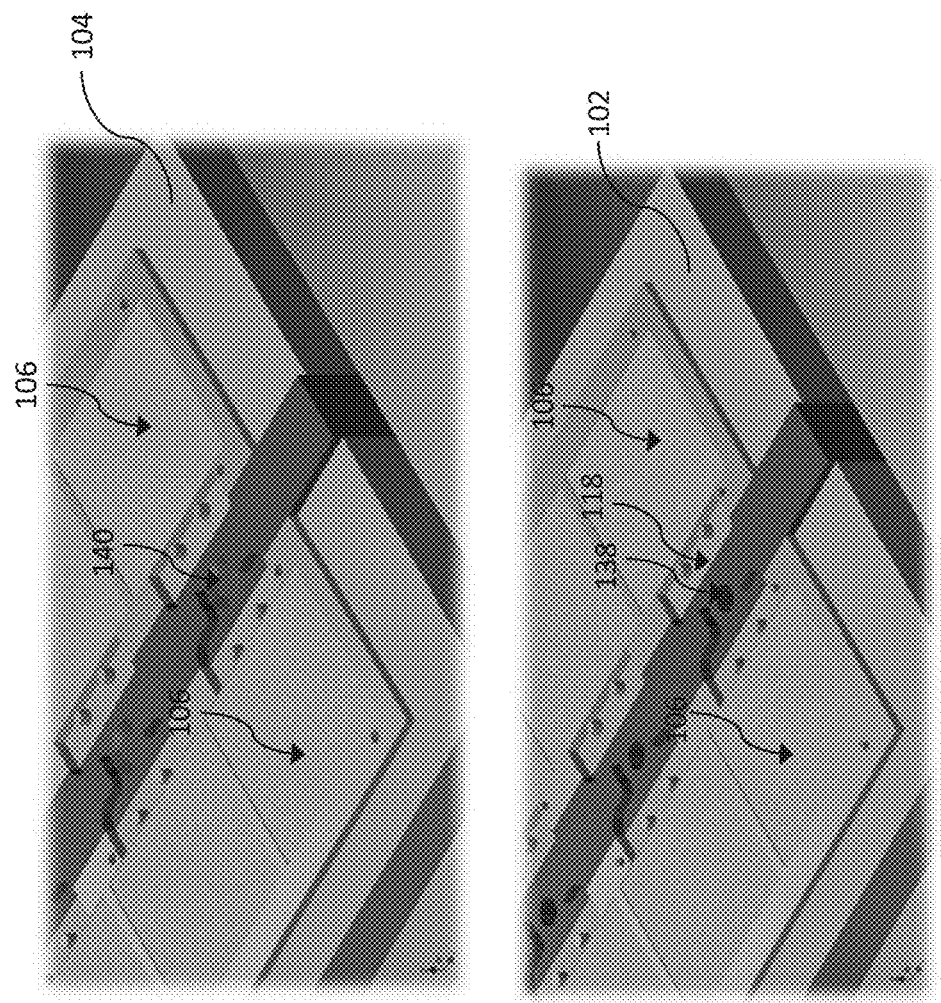
FIG. 3 illustrates a diagonal close up view of first and second mold plates that form components of a mold injection tool, according to an embodiment.

Referring to FIGS. 1, 2 and 3 a mold injection tool 100 is depicted. The mold injection tool 100 includes first and second mold plates 102, 104. The first mold plate 102 is configured with a plurality of mold cavities 106. The mold cavities 106 are intentionally formed indentations in an inner side 108 of the first mold plate 102. An outer side of the first mold plate 102 (not shown) that is opposite from the inner side may be substantially planar. The mold cavities 106 vertically project inward from the inner side 108 of the first mold plate 102. According to an embodiment, the mold cavities 106 are formed by a raised plate 110 affixed to a planar surface 112 of the first mold plate 102. In this configuration, the raised plate 110 defines the outer sidewalls of each of the mold cavities 106. The planar surface 112 defines a roof or ceiling of the mold cavities 106. Alternatively, the mold cavities 106 may be directly formed in the planar surface 112.

The mold cavities 106 are arranged in vertical columns, with a plurality of mold cavities 106 extending in a single direction with respect to the planar surface 112 of the first mold plate 102. According to an embodiment, the first mold plate 102 includes first and second columns 114, 116 of the mold cavities 106, with each of the first and second columns 114, 116 including four of the mold cavities 106.

The first mold plate 102 further includes a first cull block 118 arranged between the first and second columns 114, 116. The first cull block 118 may be a discrete structure formed within the first mold plate 102. According to an embodiment, the first mold plate 102 is formed from stainless steel coated with Chromium and the first cull block 118 is formed from stainless steel coated with Chromium or ceramic.

The first mold plate 102 may include a plurality of first channel sections 120 being formed in the inner side 108 of the first mold plate 102 between an adjacent pair of mold cavities 106 in the first and second columns 114, 116. At least a part of the first channel sections 120 may overlap with the first cull block 118 with the features of the first channel sections 120 being formed out of the first cull block 118.

According to an embodiment, the first channel sections 120 are vertically recessed below the outer sidewalls of the each of the mold cavities 106 in the first and second columns 114, 116. That is, the first channel sections 120 extend deeper into the inner side 108 of the first mold plate 102 than the mold cavities 106 such that liquefied molding material will gather in the first channel sections 120 before entering the mold cavities 106.

The first channel sections 120 and the first cull block 118 are collectively configured to cull or guide liquefied molding material from the first cull block 118 into an adjacent pair of pair of mold cavities 106 in the first and second columns 114, 116. That is, the first channel sections 120 and/or the first cull block 118 include features that direct liquefied molding material towards the adjacent pair of pair of mold cavities 106 so as to enable filling of the mold cavities 106.

According to an embodiment, the first channel sections 120 form a taper between an adjacent pair of mold cavities 106 in the first and second columns 114, 116. For example, as shown in FIGS. 1, 2 and 3, the first cull block 118 includes pairs of protrusions 122 extending towards one other to form a narrower region of the first channel sections 120. This narrower region transitions to wider regions that are immediately adjacent to the mold cavities 106 in the first and second columns 114, 116. In this way, liquefied molding material can be guided away from the narrower region and towards the mold cavities 106. Further, the first channel sections 120 may include cylindrical posts 124 adjacent to the mold cavities 106. The cylindrical posts 124 may have a height that corresponds to a vertical offset distance between the first channel sections 120 and the mold cavities 106 in the first and second columns 114, 116. For example, the cylindrical posts 124 may extend slightly above the sidewalls of the mold cavities 106 so as to enable the perforations of a lead frame structure to be placed over the cylindrical posts 124, which keeps the lead frame structure in place. The geometry and location of the cylindrical posts 124 ensures that liquefied molding material flowing across the first channel sections 120 is evenly distributed and enters the mold cavities 106 uniformly.

The mold injection tool 100 further includes a second mold plate 104. Many of the features of the second mold plate 104 may be configured substantially similar or identical to the features of the first mold plate 102. More particularly, the second mold plate 104 may include third and fourth columns 126, 128 of mold cavities 106, with each of the cavities in the third and fourth columns 126, 128 being formed in an inner side 108 of the second mold plate 104. The mold cavities 106 in the third and fourth columns 126, 128 may have an identical shape and arrangement as the mold cavities 106 in the first and second columns 114, 116. Further, the second mold plate 104 may include a raised plate 110 affixed to a planar surface 112 of the second mold plate 104, with the raised plate 110 defining outer sidewalls of each of the mold cavities 106 in the third and fourth columns 126, 128. The second mold plate 104 may further include a plurality of second channel sections 130 being formed in the inner side 108 of the first mold plate 102 between an adjacent pair of mold cavities 106 in the third and fourth columns 126, 128. Each of the second channel sections 130 may be configured to guide liquefied molding material from a second cull block 132 into an adjacent pair of mold cavities 106 in the third and fourth columns 126, 128 in a similar manner as the first channel sections 120. The second channel sections 130 may be vertically recessed below the outer sidewalls of the each of the mold cavities 106 in the third and fourth columns 126, 128, and may include cylindrical posts 124 having a height that corresponds to a vertical offset distance between the second channel sections 130 and the mold cavities 106 in the third and fourth columns 126, 128.

According to an embodiment, adjacent ones of the first and second channel sections 120, 130 form a contained chamber when the first and second mold plates 102, 104 are pressed together with the inner sides 108 of the first and second mold plates 102, 104 facing one another. That is, the second mold plate 104 can be arranged above the first mold plate 102 with corresponding features aligned with one another (e.g., with the first column 114 being aligned with the third column 128) such that pairings of the first and second channel sections 120, 130 collectively form a contained chamber. This contained chamber is adjacent to four mold cavities 106 in each of the first, second, third and fourth columns 126, 128. The contained chamber guides and culls liquefied molding material that fills the contained chamber into the four mold cavities 106 in each of the first, second, third and fourth columns 126, 128.

Figure 4:
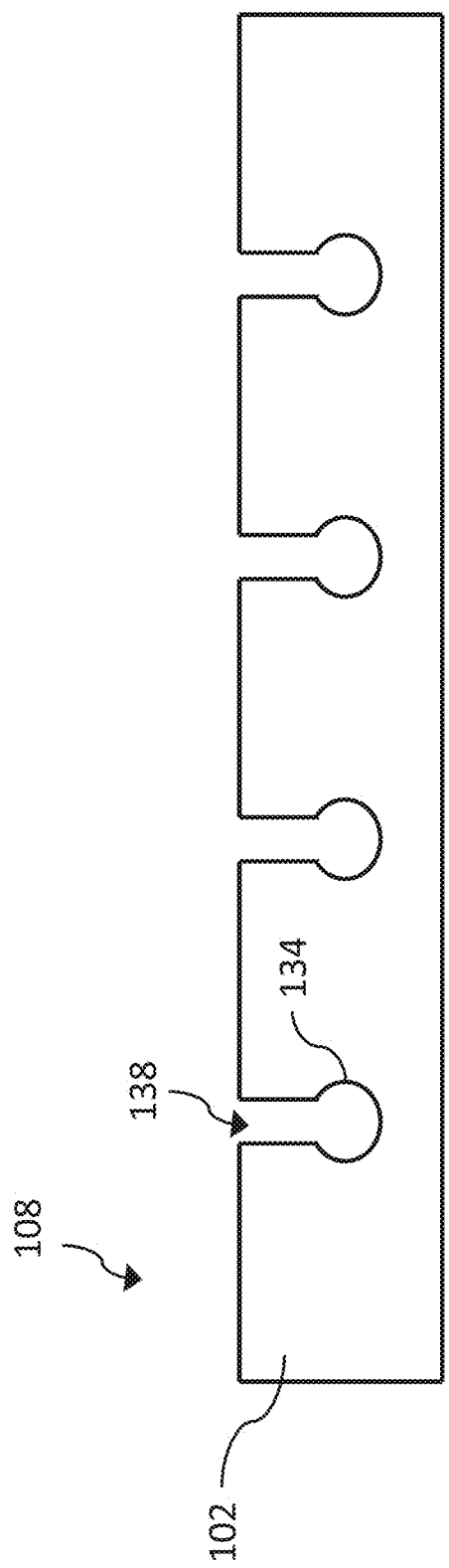
FIG. 4 illustrates a side view representation of one of the mold plates to schematically illustrate molding material chambers formed within the mold plates, according to an embodiment.

The mold injection tool 100 includes a mechanism for injecting liquefied molding material into the mold cavities 106 via the contained chamber that is formed by the first and second channel sections 120, 130. According to an embodiment, the mechanism for injecting liquefied molding material into the mold cavities 106 is provided in the first mold plate 102. For example, the first mold plate 102 may include a plurality of molding material chambers 134 beneath the inner side 108 of the first mold plate 102. A side view schematic of the first mold plate 102 is illustrated in FIG. 4 to illustrate an exemplary configuration of the molding material chambers 134. These molding material chambers 134 are in open communication with entrances 138 that are disposed on the inner side 108 of the first mold plate 102. The entrances 138 may be disposed at a center of the first cull block 118 of the first mold plate 102 in the narrower region of the first channel sections 120, for example. Liquefied molding material can be transferred from the molding material chambers 134 into the first channel sections 120 through the entrances 138, which are in open communication with each contained chamber that is formed by the first and second channel sections 120, 130 when the first and second mold plates 102, 104 are pressed together.

Different to the first mold plate 102, the second mold plate 104 may be devoid of the molding material chambers 134. According to an embodiment, the molding material chambers 134 are only be provided in the first mold plate 102. The second mold plate 104 may include a plurality of indentations 140 in the inner side 108 of the second mold plate 104 in lieu of the molding material chambers 134 and corresponding entrances 138. The indentations 140 can be arranged directly above the entrances 138 when the first and second mold plates 102, 104 are pressed together with the inner sides 108 of the first and second mold plates 102, 104 facing one another. In this configuration, as liquefied molding material exits the entrances 138 and enters the contained chambers, the indentations 140 in the second mold plates 104 direct the liquefied molding material away from the center of the contained chambers and towards the mold cavities 106 that are immediately adjacent to the respective contained chamber. The arrangement of the molding material chambers 134 and indentations 140 can be reversed with respect to the molding material chambers 134 and indentations 140. That is, the molding material chambers 134 can be provided in the second mold plates 104 and the indentations 140 can be provided in the first mold plate 102.

Figure 5:
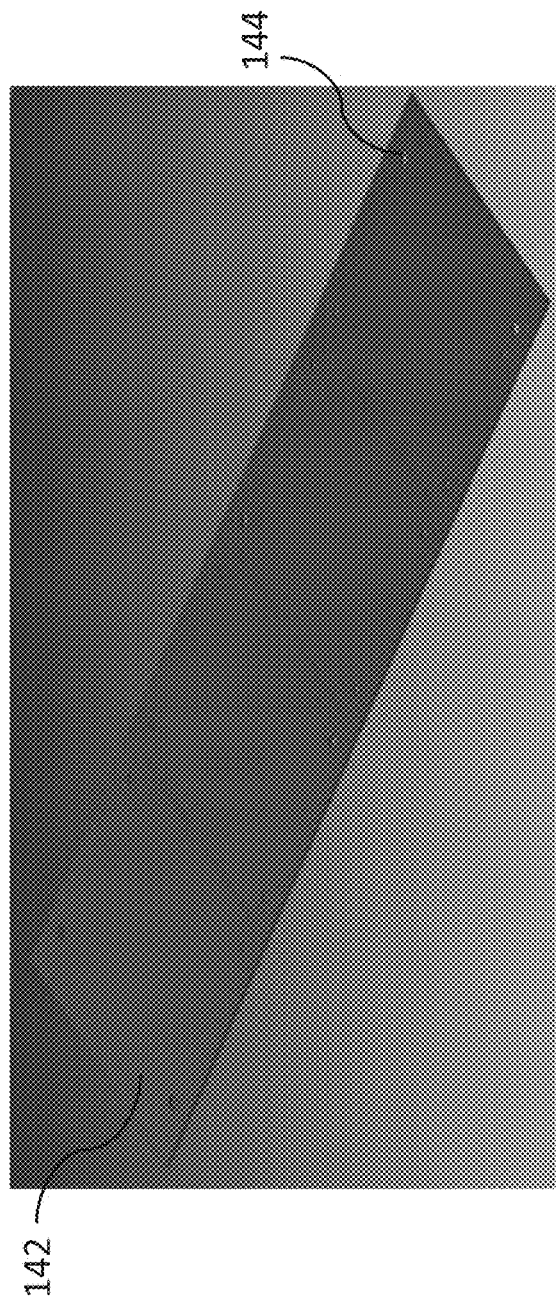
FIG. 5 illustrates an optional dummy plate that may be provided as part of a mold injection tool, according to an embodiment.

Referring to FIG. 5, a dummy plate 142 that may be a further component of the mold injection tool 100 is depicted. According to an embodiment, the dummy plate 142 includes a substantially planar surface. The dummy plate 142 is dimensioned to be placed in between two of the columns 114, 116, 126, 128 when the first and second mold plates 102, 104 are pressed together such that the columns 114, 116, 126, 128 do not contact one another. For example, an area of the dummy plate 142 may closely correspond with an area of one of the columns 114, 116, 126, 128. This allows the dummy plate 142 to be interposed between opposite facing sets of columns (e.g. between the first and third columns 114, 126 or between the second and fourth columns 116, 128) when the first and second mold plates 102, 104 are pressed together such that the outer sidewalls of the mold cavities 106 do not contact one another. The dummy plates 142 may include perforations 144 that can be placed over features of the first and second mold plates 102, 104 so as to maintain the dummy plates 142 in a stable position.

A method of encapsulating lead frame strip mounted semiconductor dies and a corresponding assembly for simultaneously encapsulating a plurality of semiconductor dies will now be discussed with reference to FIGS. 6-12.

Figure 6:
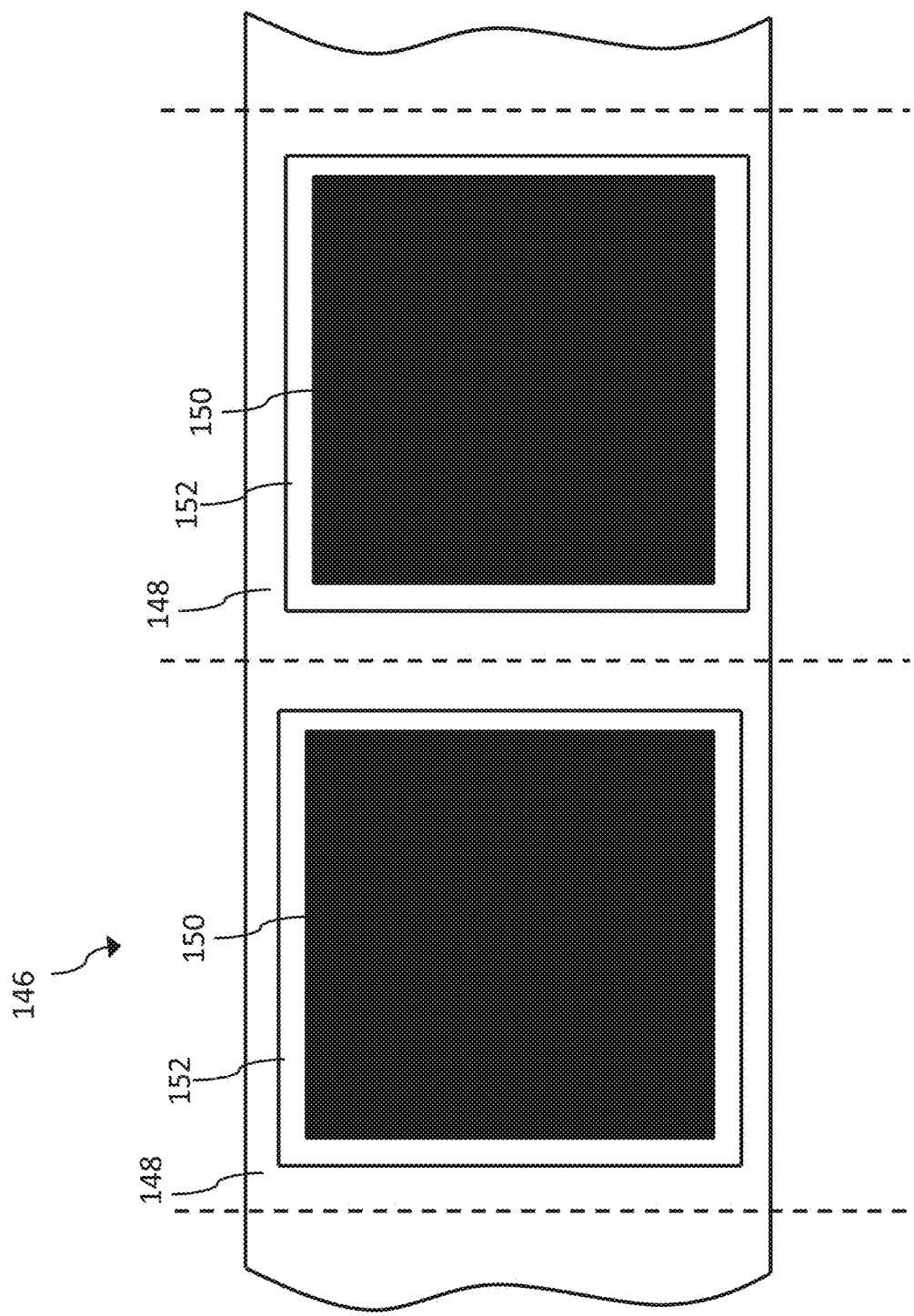
FIG. 6 illustrates a plan view of a lead frame strip having semiconductor dies mounted to and electrically connected with the lead frame strip, according to an embodiment.

Referring to FIG. 6, an exemplary lead frame strip 146 is depicted. The lead frame strip 146 includes a plurality of unit lead frames 148, with each of the unit lead frames 148 having a substantially identical configuration. One or more semiconductor dies 150 are affixed to each unit lead frame 148, e.g., by adhesive, soldering, etc., to a die mount area 152. An electrical connection between the semiconductor dies 150 and the unit lead frames 148 is effectuated, e.g., by wire bonding, soldering, etc. The lead frame strip 146 may be formed by a sheet of electrically conductive material, such as copper, aluminum etc. Any of a variety of lead configurations is possible for each unit lead frame, depending upon the application. FIG. 6 depicts one semiconductor die 150 affixed to each unit lead frame 148. This however is only an example. Any number of semiconductor dies 150 may be attached to each unit lead frame 148.

Figure 7:
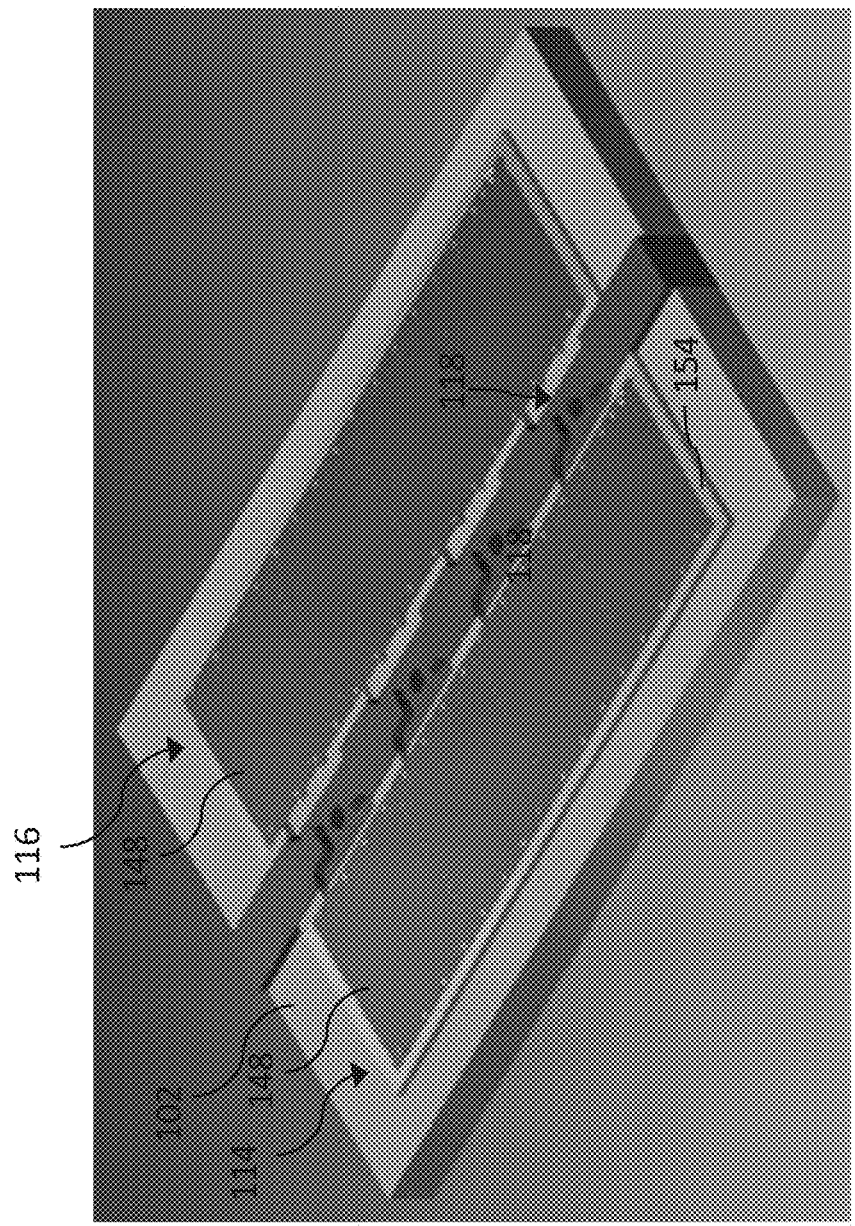
FIG. 7 illustrates a diagonal view of a first mold plate with a first pair of lead frame strips loaded into the first mold plate with the semiconductor dies facing downward into the cavities of the first mold plate, according to an embodiment.

Referring to FIG. 7, a first pair of the lead frame strips 148 is loaded into the first mold plate 102. More particularly, one of the lead frame strips 148 is loaded into the first column 114 of mold cavities 106 and a second one of the lead frame strips 148 is loaded into the second column 116 of mold cavities 106. The lead frame strips 148 are loaded such that the first and second columns 114, 116 of the first mold plate 102 each receive at least one semiconductor die 150 of the lead frame strips 148 in the first pair. The mold cavities 106 of the first and second columns 114, 116 surround and envelop the semiconductor dies 150 that are mounted to the lead frame strips 148. The first pair of the lead frame strips 148 is oriented such that the semiconductor dies 150 face towards the mold cavities 106, with a rear surface of the lead frame strips 148 facing outward when the first pair of the lead frame strips 148 is loaded into the first mold plate 102. A volume of the mold cavities 106 is at least slightly larger than the volume encompassed by the semiconductor dies 150 so that the mold cavities 106 provide an enclosed volume with which to encapsulate the semiconductor dies 150.

The first and second columns 114, 116 are configured such that one of the lead frame strips 148 may be arranged in one of the columns 114, 116, with each of the mold cavities 106 in the first and second columns 114, 116 receiving at least one semiconductor die 150 affixed to one of the lead frame strips 148 in the above described manner. That is, the first and second columns 114, 116 are dimensioned to be compatible with the lead frame strips 148. For example, the first and second columns 114, 116 may have outer rims 154 spanning an area that closely corresponds to an area of one the lead frame strips 148. This allows the lead frame strips 148 to be placed securely in the columns with the outer rims 154 exerting loose pressure on the outer sides of the lead frame strips 148. Further fastening mechanisms, such as pins, screws, etc. may be provided to prevent the lead frame strips 148 from substantially moving once placed in the first and second columns 114, 116.

Figure 8:
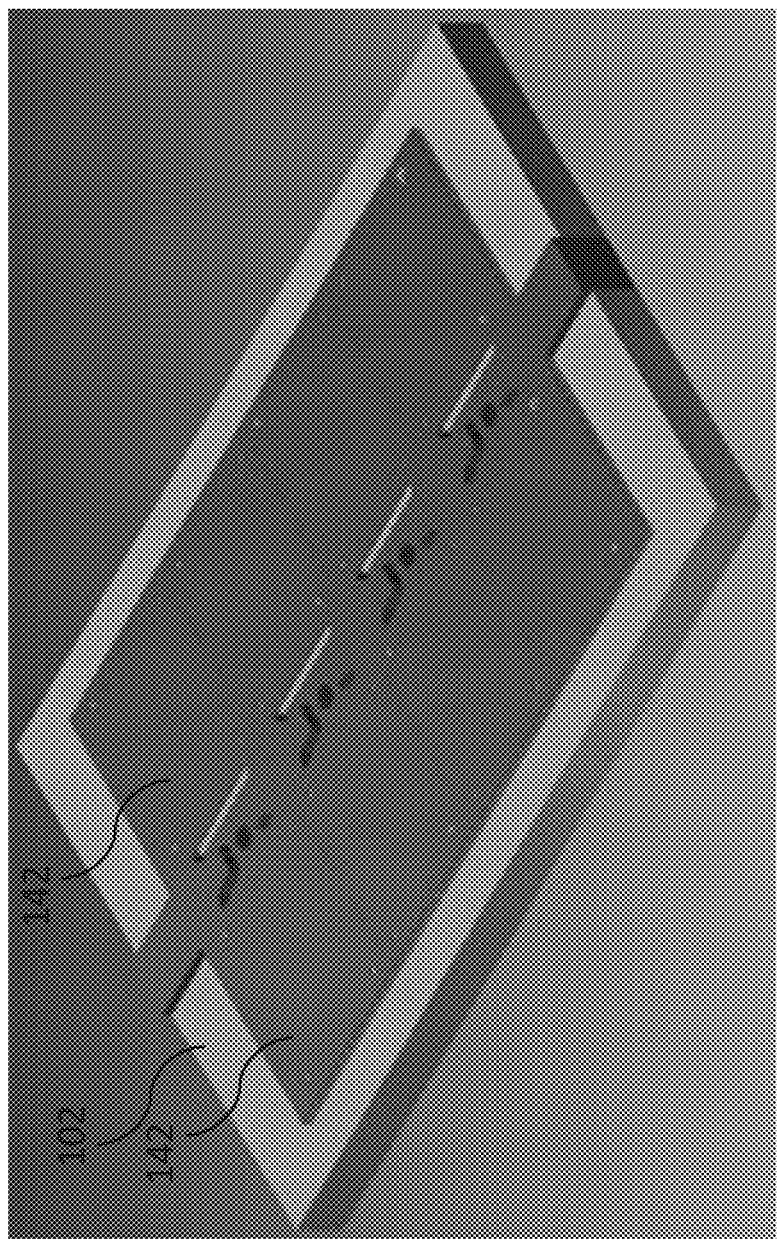
FIG. 8 illustrates the apparatus of FIG. 7 with dummy plates placed over rear surfaces of the lead frame strips, according to an embodiment.

Referring to FIG. 8, two of the optional dummy plates 142 have been loaded over the first pair of lead frame strips 148. The dummy plates 142 cover the rear surface of the lead frame strips 148. However, the dummy plates 142 do not cover the first cull block 118 or the first channel sections 120. Thus, the contained chamber that is formed when the first and second mold plates 102, 104 are pressed together is unimpeded by the inclusion of the dummy plates 142 in the molding tool. According to another embodiment, the dummy plate 142 is a continuous structure that may be placed over both columns 114, 116, 126, 128 of one of the mold plates 102, 104 with an opening at a center of the dummy plate 142 that allows molding material to flow through the opening in the contained chamber that is formed when the first and second mold plates 102, 104 are pressed together.

Figure 9:
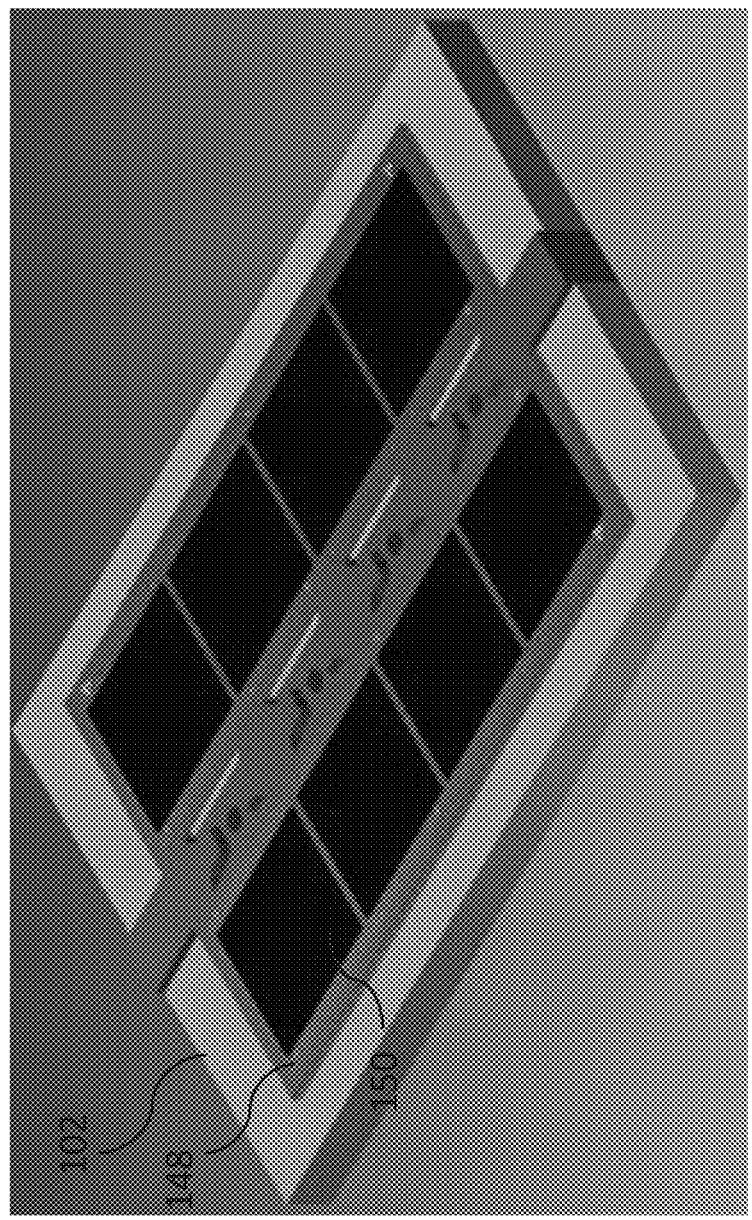
FIG. 9 illustrates the apparatus of FIG. 8 with a second pair of pair of lead frame strips mounted on top of the dummy plates and with the semiconductor dies of the second pair of lead frame strips facing in an opposite direction as the semiconductor dies of the first pair of lead frame strips, according to an embodiment.

Referring to FIG. 9, a second pair of lead frame strips 148 has been loaded onto the mold injection tool 100. The lead frame strips 148 in the second pair may be substantially similar or identical to the lead frame strips 148 in the first pair. Alternatively, the lead frame strips 148 in the second pair may differ from the lead frame strips 148 in the first pair in regards to the number of dies, die arrangement, lead configuration, etc.

Figure 10:
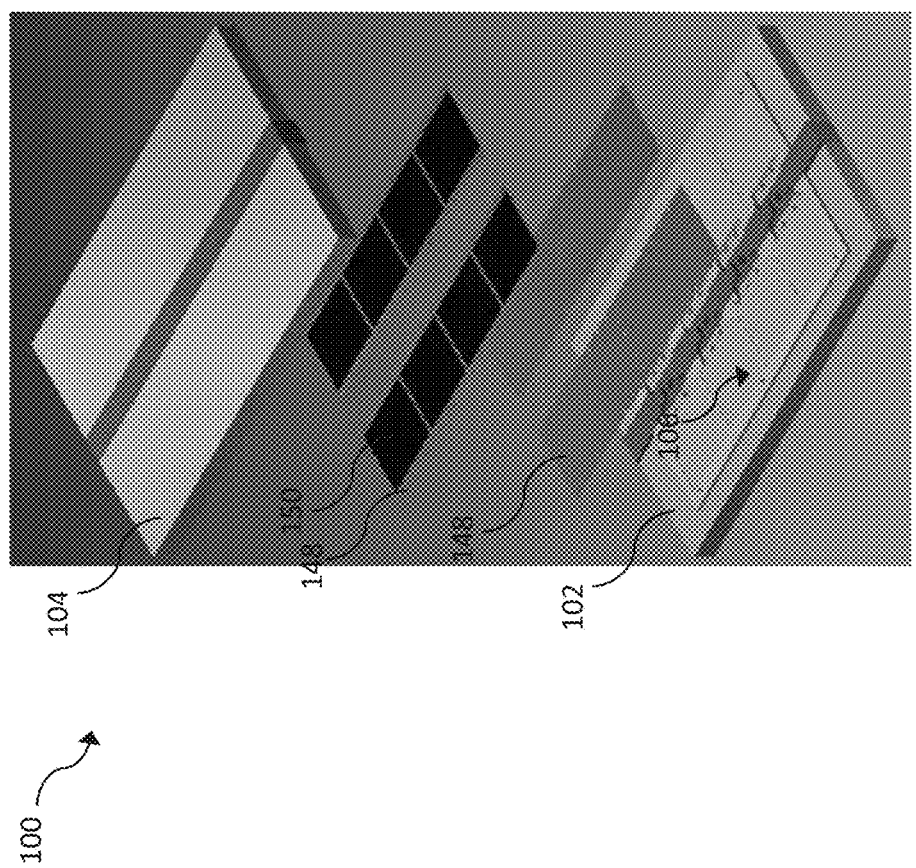
FIG. 10 illustrates an expanded view of the first and second mold plates and the first and second pair of lead frame strips to illustrate how the first and second pair of lead frame strips and first and second mold plates can be oriented relative to one another, according to an embodiment.

Referring to FIG. 10, the alignment of the first and second mold plates 102, 104 and the first and second pair of lead frame strips 148 is illustrated in an expanded view. In this view, the optional dummy plate 142 has been omitted. As shown, the respective semiconductor dies 150 in the different layers of lead frame strips 148 face away from one another. That is, the semiconductor dies 150 in the first pair of lead frame strips 148 face downward towards the mold cavities 106 of the first mold plate 102 and the semiconductor dies 150 in the second pair of lead frame strips 148 face upward towards the mold cavities 106 of the second mold plate 104. Further, in the arrangement of FIG. 10, the second pair of lead frame strips 148 is layered on top of the first pair of lead frame strips 148. The mold injection tool 100 therefore offers efficient space utilization because the first and second mold plates 102, 104 can be stacked on top of one another with the first pair of lead frame strips 148 being received by the first mold plate 102 and the second pair of lead frame strips 148 being received by the second mold plate 104. In comparison to a conventional mold injection tool 100 that uses two mold plates to accommodate one layer of lead frame strips, the mold injection tool 100 described herein uses two mold plates to accommodate two layers of lead frame strips.

Figure 11:
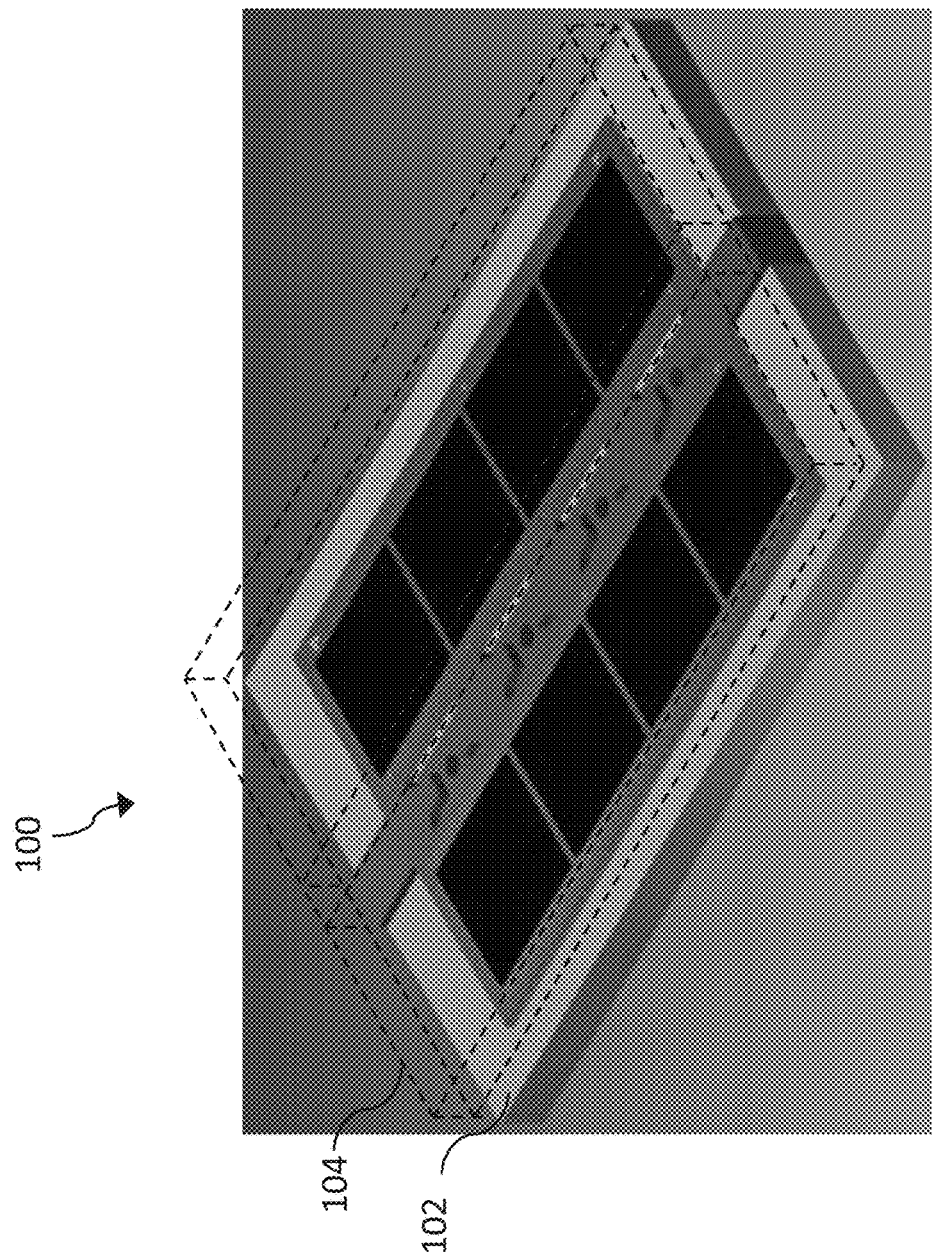
FIG. 11 schematically illustrates a second mold plate pressed against the first mold plate with the lead frame strips mounted in the configuration of FIG. 9 such that the semiconductor dies of the second pair of lead frame strips are received by the mold cavities of the second mold plate, according to an embodiment.

Referring to FIG. 11, after the first and second pair of lead frame strips 148 have been loaded into the mold injection tool 100, the first and second mold plates 102, 104 are pressed against one another. That is, the second mold plate 104 has been arranged directly above the first mold plate 102 and moved towards the first mold plate 102 such that the mold cavities 106 of the second mold plate 104 envelop and surround the semiconductor dies 150 of the second pair of lead frame strips 148 in a similar manner as described above with reference to the mold cavities 106 of the first lead frame strips 148. If the mold cavities 106 on the second mold plate 104 are configured symmetrically with respect to the mold cavities 106 on the first mold plate 102, the mold cavities 106 on the second mold plate 104 may be directly aligned with the mold cavities 106 of the first mold plate 102. The second pair of lead frame strips 148 has been positioned such that that, when the second mold plate 104 is pressed against the first mold plate 102 with the inner sides 108 of the first and second mold plates 102, 104 facing one another, the mold cavities 106 in the third and fourth columns 126, 128 of the second mold plate 104 each receive at least one semiconductor die 150 of the lead frame strips 148 in the second pair in a similar manner as previously discussed.

The dummy plates 142 physically decouple the first pair of lead frame strips 148 from the second pair of lead frame strips 148 when the lead frame strips 148 are loaded into the mold injection tool 100 with the first and second mold plates 102, 104 pressed together in the manner depicted in FIG. 11. That is, the dummy plates 142 prevent the first and second pair of lead frame strips 148 from directly contacting one another during the molding process. Furthermore, the dummy plates 142 provide physical support for the first and second lead frame strips 148, via the outer rims 154 of the columns 114, 116, 126, 128, so that one pair of the lead frame strips 148 (e.g., the first pair) does not bear the weight of the other pair of lead frame strips 148 (e.g., the second pair). Thus, in the event that the lead frame strips 148 are formed form a relatively thin conductor that is unable to support a significant amount of weight, the dummy plates 142 protect the lead frame strips 148 from breakage during the molding process. However, some lead frame strip designs are sufficiently durable to support the additional weight of another lead frame strip. Thus, according to another embodiment, the second pair of lead frame strips 148 is placed directly on the first pair of lead frame strips 148 prior to pressing the first and second mold plates 102, 104 against one another such that the rear surfaces of the first and second pair of lead frame strips 148 directly contact one another.

After pressing the first and second mold plates 102, 104 together, the semiconductor dies 150 are encapsulated by a molding process. This may be done by injecting liquefied molding material into the mold cavities 106 of the first, second, third and fourth columns 114, 116, 126, 128 via the molding material chambers 134. The liquefied molding material flows from the molding material chambers 134 through the entrances 138. According to an embodiment, hardened molding material pellets are provided in each one of the molding material chambers 134 and these pellets are heated into a liquefied state. The liquefied molding material may be pushed through the entrances 138 (e.g., using a plunger (not shown)) so as to transfer the molding material from the molding material chambers 134 to the mold cavities 106.

Before entering the mold cavities 106, the liquefied molding material fills the contained chamber formed by the first and second channel sections 120, 130 when the first and second mold plates 102, 104 are pressed together. Each contained chamber is adjacent to a set of four mold cavities 106, with one of the mold cavities 106 in the set being from each of the first, second, third and fourth columns 114, 116, 126, 128. The liquefied molding material coming from the molding material chambers 134 fills the contained chamber before ultimately entering the set of four mold cavities 106 adjacent to the contained chamber. Thus, the liquefied molding material flows through the first and second channel sections 120, 130 before entering the mold cavities 106 in the first, second, third and fourth columns 114, 116, 126, 128.

The first and second channel sections 120, 130 include features that control the flow of liquefied molding material for uniform filling of the mold cavities 106. The geometry and structure of the first and second channel sections 120, 130 ensures that the liquefied molding material flows through the first and second channel sections 120, 130 simultaneously as it fills the mold cavities 106. The taper and cylindrical posts 124 of the first and second channel sections 120, 130 control a flow rate of the liquefied molding material such that the set of four mold cavities 106 that is immediately adjacent to one of the contained chambers is filled at substantially the same rate. That is, the liquefied molding material fills each one of the mold cavities 106 immediately adjacent to one of the contained chambers in substantially the same amount of time. Thus, while the mold injection tool 100 described herein doubles the amount of lead frame strips 148 that can be encapsulated by a single mold shot in comparison to a conventional molding apparatus, the geometry of the first and second cull blocks 118, 132 and the first and second channel sections 120, 130 ensures this doubling of capacity does not increase the amount of time required for the molding material to harden.

According to an embodiment, each of the mold cavities 106 in the first, second, third, and fourth columns 114, 116, 126, 128 receives one of the semiconductor dies 150 from one of the lead frame strips 148. This allows for maximum throughput as none of the mold cavities 106 are unused. This is not necessary however, and the molding process as described herein may be carried out with at least one of the mold cavities 106 being unused. Further, the amount of semiconductor dies 150 provided within each mold cavity 106 may vary. That is, each one of the mold cavities 106 may be used to encapsulate a unit lead frame 148 with one, two, three, four, etc. semiconductor dies 150 attached to it.

In the depicted embodiments, two mold plates are used to encapsulate two layers of lead frame strips 148. This concept may be extended to further embodiments in which more than two mold plates are used to encapsulate more than two layers of lead frame strips 148. For example, a third mold plate may be provided with fifth and sixth columns of mold cavities 106, with each of the mold cavities 106 in the fifth and sixth columns being formed in an inner side of the third mold plate, and a third cull block arranged between the fifth and sixth columns. The third mold plate may be substantially similar or identical to the first and second mold plates 102, 104 described herein. A third pair of lead frame strips 148 may be loaded into the fifth and sixth columns of mold cavities 106 in a similar manner as previously described with reference to the first and second mold plates 102, 104. Subsequently, the third mold plate may be pressed against the first and second mold plates 102, 104 such that the first, second, third, fourth, fifth and sixth columns are layered on top of one another. In one embodiment, the third mold plate may have a planar back side that is flush against a planar back side of the second mold plate 104. A further pair of lead frame strips 148 may be layered on top of the third pair of lead frame strips 148 in a similar manner as previously discussed, followed by the placement of a further mold plate on top of the further pair of lead frame strips 148 such that the semiconductor dies 150 of the further pair of lead frame strips 148 are received by the further mold plate in a similar manner as previously discussed. Alternatively, the second mold plate 104 may be double sided such that it has columns of the mold cavities 106 on either side. In that instance, the third pair of lead frame strips 148 may be loaded into the columns of the mold cavities 106 on the back side of the second mold plate 104 and a further pair of lead frame strips 148 may be layered on top of the third pair of lead frame strips 148 such that the semiconductor dies 150 of the further pair of lead frame strips 148 are received by the mold cavities 106 on the third mold plate in a similar manner as previously discussed. Subsequently, liquefied molding material may be injected into the mold cavities 106 in the fifth and sixth columns simultaneously while simultaneously injecting liquefied molding material into the first, second, third and fourth columns 114, 116 126, 128 with liquefied molding material. This concept may be implemented with any number (e.g., four, five, six, etc. of the mold plates) to increase the space efficiency and throughput of the molding process. Because the cull blocks 118, 132 and channel sections 120, 130 are configured to fill the mold cavities 106 at substantially the same rate, the time required for the hardening of the molding material after encapsulation is not detrimentally impacted by layering the lead frame strips 148 on top of one another in this manner.

Figure 12:
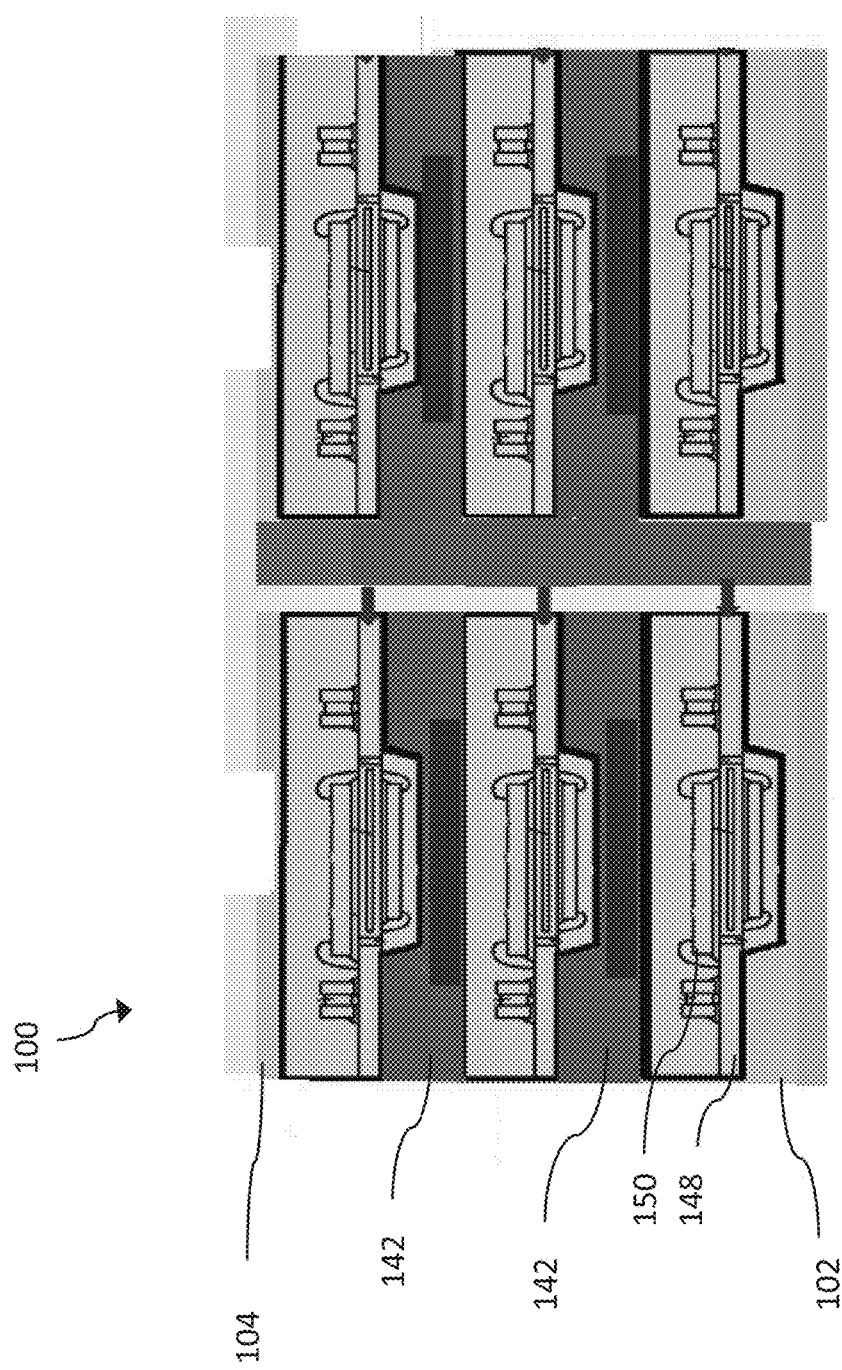
FIG. 12 illustrates a third layer of lead frame strips being arranged between the first and second mold plates, according to an embodiment.

Referring to FIG. 12, a mold injection tool 100 is depicted according to another embodiment. In the embodiment of FIG. 12, more than two pairs (e.g., three) lead frame strips 148 are loaded into the mold injection tool 100 between the first and second mold plates 102, 104. Further, the lead frame strips 148 may be double sided with two of the semiconductor dies 150 mounted to each side of the lead frame strips 146 and facing away from one another. As shown, a third pair of lead frame strips 148 is loaded in between the first and second mold plates 102, 104 such that the first, second and third pair of lead frame strips 148 are layered on top of one another and separated from one another by the dummy plates 142. Subsequently, liquefied molding material can be injected into the mold cavities 106 in the first, second, third and fourth columns 114, 116 126, 128 so as to encapsulate the semiconductor dies 150 mounted to the first, second, and third pairs of lead frame strips 148 simultaneously. This concept may be extended to any number of layers, (e.g. four pairs of lead frame strips 148 with three pairs of dummy plates 142, etc.).

The term "substantially" encompasses absolute conformity with a requirement as well as minor deviation from absolute conformity with the requirement due to manufacturing process variations, assembly, and other factors that may cause a deviation from the ideal. Provided that the deviation is within process tolerances so as to achieve practical conformity, the term "substantially" encompasses any of these deviations.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A mold injection tool for encapsulating lead frame strip mounted semiconductor dies, the mold injection tool comprising:
   a first mold plate comprising first and second columns of mold cavities, each of the cavities in the first and second columns being formed in an inner side of the first mold plate, and a first cull block arranged between the first and second columns;
   a plurality of first channel sections being formed in the inner side of the first mold plate between an adjacent pair of mold cavities in the first and second columns, each of the first channel sections being configured to guide liquefied molding material from the first cull block into the adjacent pair of mold cavities in the first and second columns;

a second mold plate comprising third and fourth columns of mold cavities, each of the cavities in the third and fourth columns being formed in an inner side of the second mold plate, and a second cull block arranged between the third and fourth columns; and a plurality of second channel sections being formed in the inner side of the second mold plate between an adjacent pair of mold cavities in the third and fourth columns, each of the second channel sections being configured to guide liquefied molding material from the second cull block into the adjacent pair of mold cavities in the third and fourth columns;

wherein adjacent ones of the first and second channel sections form a contained chamber when the first and second mold plates are pressed together with the inner sides of the first and second mold plates facing one another, wherein at least one of the first and second mold plates is configured to inject liquefied molding material through an entrance that is in open communication with each contained chamber;

a dummy plate, comprising a substantially planar surface dimensioned to be placed in between two of the columns when the first and second mold plates are pressed together such that outer sidewalls of the mold cavities that the dummy plate is interposed between do not contact one another, wherein the contained chamber is located between first, second, third and fourth ones of the mold cavities, the first and second mold cavities being opposite facing mold cavities in the first and second columns of mold cavities, the third and fourth mold cavities being opposite facing mold cavities in the third and fourth columns.

2. The mold injection tool of claim 1, wherein the first mold plate comprises a raised plate affixed to a planar surface of the first mold plate and defining outer sidewalls of each of the mold cavities in the first and second columns, and wherein the second mold plate comprises a raised plate affixed to a planar surface of the second mold and defining outer sidewalls of each the of the mold cavities in the third and fourth columns.

3. The mold injection tool of claim 2, wherein the first channel sections are vertically recessed below the outer sidewalls of the each of the mold cavities in the first and second columns, and wherein the second channel sections are vertically recessed below the outer sidewalls of each of the mold cavities in the third and fourth columns.

4. The mold injection tool of claim 3, wherein the first channel sections comprise cylindrical posts having a height that corresponds to a vertical offset distance between the first channel sections and the mold cavities in the first and second columns, and wherein the second channel sections comprise cylindrical posts having a height that corresponds to a vertical offset distance between the second channel sections and the mold cavities in the third and fourth columns.

5. The mold injection tool of claim 1, wherein a plurality of the entrances is disposed on the first cull block of the first mold plate, and wherein the first mold plate further comprises a plurality of molding material chambers being in open communication with the entrances so as to allow liquefied molding material to be transferred from the molding material chambers into the first channel sections through the entrances.

6. The mold injection tool of claim 5, wherein the second mold plate comprises a plurality of indentations, each of the indentations being formed on the second cull block in one of the second channel sections, wherein each of the indentations are arranged directly above the entrances when the first and second mold plates are pressed together with the inner sides of the first and second mold plates facing one another.

7. An assembly for simultaneously encapsulating a plurality of semiconductor dies, the assembly comprising:

a first mold plate comprising first and second columns of mold cavities, each of the cavities in the first and second columns being formed in an inner side of the first mold plate, and a first cull block arranged between the first and second columns;

a plurality of first channel sections being formed in the inner side of the first mold plate between an adjacent pair of mold cavities in the first and second columns, each of the first channel sections being configured to guide liquefied molding material from the first cull block into the adjacent pair of mold cavities in the first and second columns;

a second mold plate comprising third and fourth columns of mold cavities, each of the cavities in the third and fourth columns being formed in an inner side of the second mold plate, and a second cull block arranged between the third and fourth columns;

a plurality of second channel sections being formed in the inner side of the second mold plate between an adjacent pair of mold cavities in the third and fourth columns, each of the second channel sections being configured to guide liquefied molding material from the second cull block into the adjacent pair of mold cavities in the third and fourth columns;

a dummy plate, comprising a substantially planar surface, wherein the first mold plate is dimensioned to receive a first pair of lead frame strips in the first and second columns such that each of the mold cavities in the first and second columns receive at least one semiconductor die affixed to one of the lead frame strips in the first pair, wherein the second mold plate is dimensioned to receive a second pair of lead frame strips in the third and fourth columns such that each of the mold cavities in the third and fourth columns receive at least one semiconductor die affixed to one of the lead frame strips in the second pair, wherein the dummy plate is configured to physically decouple the first pair of lead frame strips from the second pair of lead frame strips when the first pair of lead frame strips is received by the first mold plate and the second pair of lead frame strips is received by the second mold plate and when the first and second mold plates are pressed together with the inner sides of the first and second mold plates facing one another, wherein adjacent ones of the first and second channel sections form a contained chamber when the first and second mold plates are pressed together with the inner sides of the first and second mold plates facing one another, and wherein the contained chamber is located between first, second, third and fourth ones of the mold cavities, the first and second mold cavities being opposite facing mold cavities in the first and second columns of mold cavities, the third and fourth mold cavities being opposite facing mold cavities in the third and fourth columns.

8. The assembly of claim 7, wherein the first and second mold plates are configured to be stacked on top of one another such that, when the that the first pair of lead frame strips is received by the first mold plate and the second pair of lead frame strips is received by the second mold plate, the second lead frame strip is layered on top of the first lead frame strip.

9. The assembly of claim 8, wherein the first and second columns are each dimensioned to receive one of the lead frame strips of the first pair with the semiconductor dies affixed to the lead frame strips of the first pair facing downward into the mold cavities, and wherein the third and fourth columns are each dimensioned to receive one of the lead frame strips of the second pair with the semiconductor dies affixed to the lead frame strips of the second pair facing upward into the mold cavities.

10. The mold injection tool of claim 1, wherein the contained chamber comprises a narrower central section and first and second wider sections, the first wider section extending form the narrower section to the first and third columns, the second wider section extending form the narrower section to the second and fourth columns.

11. The mold injection tool of claim 10, wherein the entrance is disposed in the narrower central section.

12. The mold injection tool of claim 11, wherein the entrance is disposed is the first mold plate, wherein the second mold plate comprises an indentation in the narrower section of the contained chamber that is arranged directly above the entrance.

* * * * *